United States Patent [19]
Nakanishi et al.

[11] Patent Number: 5,252,553
[45] Date of Patent: Oct. 12, 1993

[54] PROCESS FOR PREPARING A SUPERCONDUCTING THIN FILM OF COMPOUND OXIDE

[75] Inventors: Hidenori Nakanishi; Shinichi Shikata; Hideo Itozaki, all of Hideo, Japan

[73] Assignee: Sumitomo Electric Industries, Ltd., Osaka, Japan

[21] Appl. No.: 885,848

[22] Filed: May 20, 1992

[30] Foreign Application Priority Data

May 20, 1991 [JP] Japan ................... 3-144022

[51] Int. Cl.$^5$ ................... H01L 39/00; C23C 14/34
[52] U.S. Cl. ................... 505/1; 204/192.24; 427/62; 505/730; 505/731; 505/732
[58] Field of Search ....... 204/192.24; 505/1, 730-732; 427/62

[56] References Cited

PUBLICATIONS

H. Myoren et al, *Jap. J. Appl. Phys.*, vol. 27, No. 6, Jun. 1988, pp. L1068-L1070.
K. Harada et al, *Jap. J. Appl. Phys.*, vol. 27, No. 8, Aug. 1988, pp. L1524-L1526.
M. Migliuolo et al, *Appl. Phys. Lett.*, vol. 54, No. 9, Feb. 1989, pp. 859-861.

*Primary Examiner*—Aaron Weisstuch
*Attorney, Agent, or Firm*—Kerkam, Stowell, Kondracki & Clarke

[57] ABSTRACT

In order to prepare a good quality crystalline thin film of compound oxide superconductor on a silicon wafer, before the thin film of compound oxide superconductor is deposited on the silicon wafer, the silicon wafer is first heated at a temperature of higher than 900° C. in a high vacuum of less than $10^{-6}$ Torr, then, a thin film of $ZrO_2$ is deposited on the silicon wafer, and finally, the thin film of $ZrO_2$ deposited on the silicon wafer is annealed in air at a temperature of 800° to 850° C.

6 Claims, No Drawings

PROCESS FOR PREPARING A SUPERCONDUCTING THIN FILM OF COMPOUND OXIDE

BACKGROUND OF THE INVENTION

1. Field of the Invention

The present invention relates to an improvement in a process for preparing a well-ordered crystalline thin film of copper-containing superconducting compound oxide such as YBCO on a silicon wafer substrate, more particularly, to a process for pre-treating a surface of the silicon wafer substrate.

2. Description of the related art

The superconducting phenomenon has been explained as a unique phenomenon which can be observed only at extremely low temperatures which can be realized with liquid helium. However, a new type superconducting compound oxide of $(La, Sr)_2CuO_4$ which exhibits superconductivity at 30° K. was reported in 1986 by Bednorz and Müller (Z. Phys. B64, (1986) 189). Then, another superconducting material of $YBa_2Cu_3O_y$ having a higher critical temperature of about 90° K. was reported in 1987 by C.W. Chu et al. (Physical Review Letters, Vol. 58, No. 9, p. 908) and then Maeda et al. reported a so-called bismuth type compound oxide superconductor having a critical temperature of about 100° K. in 1988 (Japanese Journal of Applied Physics. Vol. 27, No. 2, p. 1209 to 1210).

These superconducting compound oxides are expected to be utilized in actual uses of superconductors because the superconducting phenomenon can be realized with a relatively cheap cryogen of liquid nitrogen. In the early stages of development, these superconducting compound oxides were obtained as sintered bodies by solid reaction but it later became possible to prepare thin films of these superconducting compound oxide materials.

When thin films of oxide superconductor are used in electronics, it is required to prepare thin films whose crystals are well-oriented. In fact, oxide superconductors possess high anisotropy in their superconducting properties and hence it is necessary to control the crystal orientation during the film-forming stage so as to adjust to particular applications. In the thin films of oxide superconductors, higher current flows along a direction which is perpendicular to the c-axis. For example, when a thin film of oxide superconductor is used as superconducting wiring lines in a circuit, it is required to pass superconducting current along a direction which is parallel with a surface of the substrate. In this case, the c-axis of crystals of the thin film must be oriented perpendicularly with respect to the surface of the substrate. In other words, (110) oriented thin films of oxide superconductor are required in these applications. In another application such as layered superconductor-insulator-superconductor (SIS) type devices, it is required to pass superconducting current along a direction which is perpendicular to the surface of the substrate. In this case, the c-axis of the crystals of the thin film prepared must be oriented parallel with the surface of the substrate. In other words, (100) oriented thin films or (110) oriented thin films of oxide superconductor are required in these applications.

The importance of selection of the deposition plane of the substrate or optimization of deposition conditions, particularly substrate temperature, for realizing a desired crystal orientation in a thin film of oxide superconductor, was reported in many papers, including Enomoto et al., in Japanese Journal of Applied Physics, Vol. 26, No. 7, July 1987, pp. L1248-L1250, and Asano et al. in Japanese Journal of Applied Physics, Vol. 28, No. 6, June 1989, pp. L981-L983.

A predetermined crystal orientation of oxide superconductors can be realized only under predetermined conditions and on predetermined substrate materials. In fact, the substrate on which a thin film of oxide superconductor is deposited must be selected from those that have well-matched lattice constants and do not diffuse or migrate into the superconductor, such as MgO (100) single crystal or $SrTiO_3$ (100) or (110) single crystal.

Use of these substrates in industrial applications, however, is limited because they are costly materials and are not mass produced. Further, since the diameters of these oxide single crystal substrates are limited, it is impossible to produce a thin film of oxide superconductor having a large area which will be required in the near future.

Therefore, it is proposed to use, as a substrate, a silicon single crystal (silicon wafer), which is less expensive and is available in the market, so as to prepare a thin film of oxide superconductor thereon.

However, when a thin film of oxide superconductor is deposited on a silicon wafer, the superconducting properties of the resulting thin film are seriously deteriorated or lost due to chemical reaction between the oxide of which the superconducting thin film is made and the silicon of which the substrate is made.

In order to solve this problem, it has been proposed to interpose a buffer layer between the silicon wafer and the thin film of oxide superconductor so as to prevent the reaction. However, the known buffer layers are not satisfactory as to control or adjustment of the crystal orientation of a thin film of oxide superconductor which is deposited thereon.

The present applicant proposed to interpose two intermediate layers between a silicon wafer and a thin film of oxide superconductor in U.S. patent application Ser. No. 07/806,329 which corresponds to EP patent application No. 91 403 398.0.

Therefore, an object of the present invention is to solve the problem and to provide a pre-treatment process of the silicon wafer, which permits preparation of a thin film of oxide superconductor having a desired crystal orientation on a silicon wafer.

SUMMARY OF THE INVENTION

The present invention provides a process for preparing a thin film of compound oxide superconductor on a substrate of silicon wafer, characterized by a first step of heating the silicon wafer at a temperature of higher than 900° C. in high vacuum of lower than $10^{-6}$ Torr, a second step of depositing a thin film of $ZrO_2$ on the silicon wafer, a third step of annealing the thin film of $ZrO_2$ deposited on the silicon wafer in air at a temperature of 800° to 850° C., and the final step of depositing the thin film of compound oxide superconductor.

An essence of the present invention resides in that, in a process for depositing a thin film of oxide superconductor on a silicon wafer, a surface of the silicon wafer is subjected to a predetermined pretreatment before deposition of a buffer layer on which the thin film of oxide superconductor is deposited.

All of said steps are preferably carried out successively in the same vacuum chamber.

In the process according to the present invention a silicon wafer to be used is heat-treated in a high-vacuum so that the surface of the silicon wafer is highly cleaned. The degree of vacuum is preferably lower than $10^{-6}$ Torr and the silicon wafer is preferably heated at a temperature above 900° C. Advantageously, the silicon wafer can be washed also with hydrogen fluoride (HF) or the like before the heat-treatment.

When a (110) oriented or (001) oriented thin film of oxide superconductor is desired, deposition is effected on a (100) plane of the silicon wafer.

On the resulting cleaned silicon wafer, a thin film of $ZrO_2$ which functions as a buffer layer for a thin film of oxide superconductor to be deposited directly thereon is deposited by any known technique including sputtering and molecular beam epitaxy (MBE).

The thin film of $ZrO_2$ preferably has a thickness between 10 and 1,000 Å. If the thickness of the buffer layer is less than 10 Å, it is difficult to prevent migration or diffusion of silicon from the substrate to the thin film of oxide superconductor. On the contrary, if the thickness of the buffer layer is thicker than 1,000 Å. the surface condition of the buffer layer is ruined or degraded such that the properties of the thin film of oxide superconductor deposited thereon are degraded.

The annealing of the thin film of $ZrO_2$ deposited on the silicon wafer can be carried out in air at a temperature of 800° to 850° C. The surface of the thin film of $ZrO_2$ becomes smooth by this annealing and hence crystallinity of the thin film of oxide superconductor to be deposited directly thereon is improved. The annealing is preferably carried out for a time duration of between 1 and 5 hours.

If the annealing is effected at a temperature lower than 800° C., the advantages of the annealing can not be expected. On the contrary, if the annealing is effected at a temperature higher than 850° C., silicon diffuses excessively and the properties of the thin film of $ZrO_2$ are also deteriorated.

On the thus pre-treated silicon wafer a thin film of a compound oxide superconductor including Y-type, Bi-type, or Tl-type can be grown epitaxially. The thin films of oxide superconductors can be prepared by any known technique such as sputtering.

The process according to the present invention is applicable to any known oxide superconductors and is advantageously applicable to Y-Ba-Cu-O oxide superconductors such as $Y_1Ba_2Cu_3O_{7-x}$ ($x=\pm1$), Bi-Sr-Ca-Cu-O oxide superconductors such as $Ba_1Sr_2Ca_2Cu_3O_{10-x}$ ($x=\pm1$) and Tl-Ba-Ca-Cu-O oxide superconductors such as $Tl_2Ba_2Ca_2Cu_3O_{10-x}$ ($x=\pm1$) which have the most attractive properties including high critical temperatures.

As is stated above, it is known that effective thin films of all oxide superconductors can be deposited only on predetermined crystalline surfaces and that diffusion of silicon into the thin film of oxide superconductor results in deterioration and loss of superconducting properties. Several materials for the buffer layer have been proposed. Known materials for the buffer layer are selected from those that can produce crystalline surfaces which are suitable for realizing thin films of oxide superconductor thereon and which function as a diffusion barrier to silicon and the constituent elements of the oxide superconductor. In fact, known buffer layers are satisfactory to prevent diffusion of silicon but contribute little to crystal growth of the thin film of oxide superconductor deposited directly thereon.

According to the present invention, the buffer layer on which a thin film of oxide superconductor is deposited is made of a material Which does not or reacts only a little with the superconductor, has well-matched lattice constants with crystals of the superconductor and also has a predetermined crystal orientation, so that the thin film of oxide superconductor deposited on the buffer layer grows epitaxially and possesses a well-ordered crystal orientation, and hence, thin films of compound oxide superconductors prepared by the process according to the present invention have improved crystallinity and show improved critical current density (Jc).

Use of a silicon single crystal wafer as a substrate is very advantageous in the field of electronic devices since a variety of fine processing techniques of silicon wafers are known and applicable in addition to such merits that single crystal silicon wafers are less expensive and readily available in the market. And also, a thin film having a large area can be prepared because a silicon wafer having a large diameter is available in the market.

DESCRIPTION OF THE PREFERRED EMBODIMENTS

Now, the present invention will be described with reference to Examples, but the scope of the present invention should not be limited thereto.

Example 1

An (001) oriented thin film of Y-Ba-Cu compound oxide superconductor was prepared by the process according to the present invention.

Ten silicon wafers were used. The thin film was deposited on the (100) plane of the silicon wafer.

Five silicon wafers were washed with a 50% solution of hydrogen fluoride and placed in a furnace at 930° C. under a vacuum of less than $1\times10^{-6}$ Torr for one hour.

A thin film of $ZrO_2$ was deposited on each of the thus treated five silicon wafers and five untreated silicon wafers by MBE using Zr metal under the conditions shown in Table 1.

TABLE 1

| Substrate temperature | 800 | [°C.] |
|---|---|---|
| Gas pressure | $1\times10^{-6}$ | [Torr] |
| Deposition rate | 0.5 | [Å/min] |
| Film thickness | 300 | [Å] |

Then, a thin film of Y-Ba-Cu compound oxide was deposited on each of the total of ten silicon wafers each having a thus deposited $ZrO_2$ thin film by magnetron sputtering using a sintered block target having a composition of Y:Ba:Cu=1:2:3.8 under the conditions shown in Table 2.

TABLE 2

| Substrate temperature | 600 | [°C.] |
|---|---|---|
| Gas composition | Ar containing 20% of oxygen | |
| Gas pressure | 0.5 | [Torr] |
| Deposition rate | 18 | [Å/min] |
| Film thickness | 1,000 | [Å] |

The critical temperature (Tc) and the critical current density (Jc) were determined. The results are summarized in Table 3. The value of the critical current density (Jc) was determined at 77° K.

TABLE 3

| Sample No. | Critical current density (A/cm$^2$) | Critical temperature (K.) | Heat-cleaning |
|---|---|---|---|
| 01 | 2.0 × 10$^6$ | 89 | yes |
| 02 | 1.7 × 10$^6$ | 87 | yes |
| 03 | 1.4 × 10$^6$ | 88 | yes |
| 04 | 1.1 × 10$^6$ | 87 | yes |
| 05 | 1.0 × 10$^6$ | 86 | yes |
| 06 | 5.2 × 10$^5$ | 84 | no |
| 07 | 2.4 × 10$^5$ | 84 | no |
| 08 | 1.2 × 10$^5$ | 82 | no |
| 09 | 6.0 × 10$^4$ | 80 | no |
| 10 | 4.0 × 10$^4$ | 78 | no |

Example 2

Example 1 was repeated by the Y-Ba-Cu compound oxide was replaced by Bi-Sr-Ca-Cu compound oxide.

In Example 2, a thin film of the Bi-Sr-Ca-Cu compound oxide was deposited on a silicon wafer having the ZrO$_2$ thin film by magnetron sputtering using a sintered block target having a composition of Bi:Sr:Ca:Cu=2:2:2:3 under the conditions shown in Table 4.

TABLE 4

| Substrate temperature | 780 | [°C.] |
|---|---|---|
| Gas composition | Ar containing 20% of oxygen | |
| Gas pressure | 0.7 | [Torr] |
| Deposition rate | 10 | [Å/min] |
| Film thickness | 2,000 | [Å] |

The critical temperature (Tc) and the critical current density (Jc) were determined. The results are summarized in Table 5. The value of the critical current density (Jc) was determined at 77° K.

TABLE 5

| Sample No. | Critical current density (A/cm$^2$) | Critical temperature (K.) | Heat-cleaning |
|---|---|---|---|
| 11 | 2 × 10$^6$ | 90 | yes |
| 12 | 1.1 × 10$^6$ | 88 | yes |
| 13 | 0 | 70 | no |
| 14 | 0 | 72 | no |

We claim:

1. A process for preparing a thin film of compound oxide superconductor on a silicon wafer substrate, characterized by a first step of heating said silicon wafer at a temperature of higher than 900° C. in a high vaccum of less than 10$^{-6}$ Torr, a second step of depositing a thin film of ZrO$_2$ on said silicon wafer, a third step of annealing said thin film of ZrO$_2$ deposited on said silicon wafer in air at a temperature of 800° to 850° C., and a final step of depositing said thin film of compound oxide superconductor on said silicon wafer.

2. The process set forth in claim 1, wherein all of said steps are successively carried out in the same vacuum chamber.

3. The process set forth in claim 1, wherein said compound oxide superconductor is a Y-Ba-Cu-O oxide superconductor.

4. The process set forth in claim 1, wherein said compound oxide superconductor is a Bi-Sr-Ca-Cu-O oxide superconductor.

5. The process set forth in claim 1, wherein said thin film of ZrO$_2$ is deposited by a MBE technique.

6. The process set forth in claim 1, wherein said thin film of compound oxide superconductor is deposited by a sputtering method.

* * * * *